United States Patent
Pedone et al.

(10) Patent No.: US 11,276,680 B2
(45) Date of Patent: Mar. 15, 2022

(54) POWER SEMICONDUCTOR DEVICE WITH INTEGRATED TEMPERATURE PROTECTION

(71) Applicant: Infineon Technologies Austria AG, Villach (AT)

(72) Inventors: Daniel Pedone, Munich (DE); Hans-Joachim Schulze, Taufkirchen (DE); Rolf Gerlach, Starnberg (DE); Christian Kasztelan, Munich (DE); Anton Mauder, Kolbermoor (DE); Hubert Rothleitner, Villach (AT); Wolfgang Scholz, Olching (DE); Philipp Seng, Munich (DE); Peter Tuerkes, Unterhaching (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/920,374

(22) Filed: Oct. 22, 2015

(65) Prior Publication Data

US 2016/0133620 A1    May 12, 2016

(30) Foreign Application Priority Data

Oct. 23, 2014  (DE) .......................... 102014115464.9

(51) Int. Cl.
*H01L 27/02*  (2006.01)
*H01L 27/06*  (2006.01)
(Continued)

(52) U.S. Cl.
CPC ...... *H01L 27/0259* (2013.01); *H01L 27/0255* (2013.01); *H01L 27/0623* (2013.01);
(Continued)

(58) Field of Classification Search
CPC ............ H01L 27/0259; H01L 27/0255; H01L 27/0635; H01L 21/823481; H01L 21/8249
See application file for complete search history.

(56) References Cited

U.S. PATENT DOCUMENTS 5,903,034 A * 5/1999 Sakamoto ........... H01L 27/0629
                                              257/368
7,737,521 B2  6/2010 Zundel et al.
(Continued)

FOREIGN PATENT DOCUMENTS

DE   102004021393 A1  12/2005
EP       0353509 A1   2/1990
(Continued)

*Primary Examiner* — Brigitte A Paterson
(74) *Attorney, Agent, or Firm* — Murphy, Bilak & Homiller, PLLC

(57) ABSTRACT

A temperature protected power semiconductor device has a substrate which includes a power field effect transistor (FET) and a thermosensitive element. The power FET has a gate electrode connected to a gate, a drift region, and first and second terminals for a load current. The load current is controllable during operation by a voltage applied between the gate and the first terminal. The thermosensitive element has a first contact connected to one of the gate electrode and first terminal of the power FET, and a second contact connected to the other one of the gate electrode and first terminal. The thermosensitive element is located close to the power FET and thermally coupled thereto. The thermosensitive element is configured to cause the power FET to reduce the load current in case of an exceedance of a limit temperature of the power FET, by interconnecting the gate and first terminal.

18 Claims, 11 Drawing Sheets

(51) Int. Cl.
*H01L 29/739* (2006.01)
*H01L 29/866* (2006.01)
*H01L 21/8249* (2006.01)

(52) U.S. Cl.
CPC ...... H01L 27/0629 (2013.01); H01L 29/7393 (2013.01); *H01L 21/8249* (2013.01); *H01L 29/866* (2013.01)

(56) References Cited

U.S. PATENT DOCUMENTS

| | | | |
|---|---|---|---|
| 8,084,304 B2 | 12/2011 | Pan et al. | |
| 2002/0195657 A1 | 12/2002 | Williams et al. | |
| 2004/0058503 A1* | 3/2004 | Cha | H01L 21/8249 438/326 |
| 2005/0194635 A1 | 9/2005 | Pfirsch | |
| 2009/0231766 A1* | 9/2009 | Chang | H01L 27/0277 361/56 |
| 2010/0321092 A1 | 12/2010 | Momota et al. | |
| 2011/0012195 A1* | 1/2011 | Momota | H01L 29/7815 257/334 |
| 2011/0026174 A1* | 2/2011 | Klein | H01L 27/0259 361/56 |
| 2013/0256748 A1* | 10/2013 | Clark, Jr. | H01L 21/823821 257/173 |
| 2016/0064917 A1 | 3/2016 | Lee et al. | |

FOREIGN PATENT DOCUMENTS

| | | |
|---|---|---|
| EP | 1237197 A2 | 9/2002 |
| KR | 101446994 B1 | 10/2014 |

* cited by examiner

POWER SEMICONDUCTOR DEVICE WITH INTEGRATED TEMPERATURE PROTECTION

PRIORITY CLAIM

This application claims priority to German Patent Application No. 10 2014 115 464.9 filed on 23 Oct. 2014, the content of said application incorporated herein by reference in its entirety.

TECHNICAL FIELD

Embodiments of the present invention relate to semiconductor devices having thermal protection, and more particularly to temperature protected power semiconductor devices which are vertical field-effect power semiconductor devices.

BACKGROUND

Thermal Short Circuit (SC) robustness of field effect controlled power devices is mandatory, as this is a specified operational condition that is likely to occur in several applications. E.g., today's IGBTs withstand the thermal short circuit condition for several µs until the device temperature, and therewith the leakage current, rises to a certain critical level. From that level on, after the short circuit event, thermal runaway typically leads to destruction of the device.

Another problematic issue is the possibility of a filamentation of the load current during normal operation of a power semiconductor device, which is characterized by a concentration of the load current on certain areas, groups of single (transistor) cells or even single cells of the power semiconductor device. This may lead to the destruction of the component. For example, in gated power MOSFETs, below the temperature-stable point the current density may steadily continue to increase in regions of high temperature, until these regions are destroyed, eventually leading to the destruction of the device as a whole.

To date, short circuit detection and device turn-off are typically externally triggered, for example by the gate driver of the power device. The turn-off is then triggered either by measuring the source-collector voltage, which tremendously increases during a short circuit, or by measuring the device temperature, e.g. by measuring temperature dependent forward voltage of a pn junction or the threshold voltage of a MOS channel. However, these measures which are used to turn off the power device all take a certain detection time and/or trigger time, which is typically greater than 5 µs. When the transconductance of the power device is designed to be very high, which is desirable from a standpoint of, e.g., effectiveness, this amount of time may be sufficient for a thermal runaway to occur, with subsequent destruction of the power device. Hence, in case of a short circuit, the short circuit current is limited by the transconductance, which avoids or at least strongly reduces the risk of thermal runaway as described. Therefore, conventional power devices having protection mechanisms as described are usually designed to have a limited transconductance.

SUMMARY

According to an embodiment of a temperature protected power semiconductor device, the temperature protected power semiconductor device comprises a substrate which includes a power field effect transistor (FET) and a thermosensitive element. The power FET has a gate electrode connected to a gate, a drift region, and a first terminal and a second terminal for a load current. The load current is controllable during operation by a voltage applied between the gate and the first terminal. The thermosensitive element has a first contact and a second contact. The first contact is connected to one of the gate electrode and the first terminal of the power FET, and the second contact is connected to the other one of the gate electrode and the first terminal. The thermosensitive element is located close to the power FET and is thermally coupled to the power FET. The thermosensitive element is configured to cause the power FET to reduce the load current in case of an exceedance of a limit temperature of the power FET, by interconnecting the gate and the first terminal.

According to an embodiment of a method for producing a temperature protected power semiconductor device, the method comprises: providing a substrate; forming, in the substrate, a power field effect transistor comprising a gate electrode connected to a gate, a drift region, and a first terminal and a second terminal for a load current; and forming a thermosensitive element having a negative temperature coefficient and comprising two contacts, wherein a first contact is connected to one of the gate electrode and the first terminal of the power field effect transistor and a second contact is connected to the other one of the gate electrode and the first terminal of the power field effect transistor. The thermosensitive element is located close to the power field effect transistor and is thermally coupled to the power field effect transistor. The thermosensitive element is configured to cause the power field effect transistor to reduce the load current in case of an exceedance of a limit temperature of the power field effect transistor, by interconnecting the gate and the first terminal.

Those skilled in the art will recognize additional features and advantages upon reading the following detailed description, and upon viewing the accompanying drawings.

BRIEF DESCRIPTION OF THE DRAWINGS

The components in the Figures are not necessarily to scale, instead emphasis being placed upon illustrating the principles of the invention. Moreover, in the Figures, like reference numerals designate corresponding parts. In the drawings.

DETAILED DESCRIPTION

Figure 1:
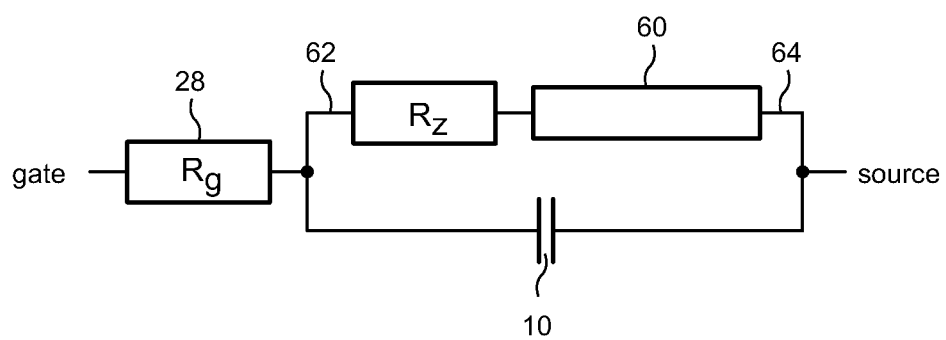
FIG. 1 shows an equivalent circuit according to embodiments of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the Figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a main surface of a semiconductor substrate or body. This can be for instance the upper surface or front surface but also a lower or backside surface of a wafer or a die.

The term "vertical" as used in this specification intends to describe an orientation which is substantially arranged perpendicular to the main surface, i.e. parallel to the normal direction of the main surface of the semiconductor substrate or body.

The terms "above" and "below" as used in this specification intends to describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n$^−$" means a doping concentration which is less than the doping concentration of an "n"-doping region while an "n$^+$"-doping region has a larger doping concentration than the "n"-doping region. However, indicating the relative doping concentration does not mean that doping regions of the same relative doping concentration have to have the same absolute doping concentration unless otherwise stated. For example, two different n$^+$-doping regions can have different absolute doping concentrations. The same applies, for example, to an n$^+$-doping and a p$^+$-doping region.

Specific embodiments described in this specification pertain to, without being limited thereto, to vertical semiconductor devices such as vertical n-channel or p-channel MOSFETs or IGBTs, in particular to vertical power MOSFETs and vertical power IGBTs, and to manufacturing methods therefor.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs (field-effect transistors) having a gate insulator that is not an oxide, i.e. the term MOSFET is used in the more general term meaning of IGFET (insulated-gate field-effect transistor) and MISFET (metal-insulator-semiconductor field-effect transistor), respectively.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region of the first conductivity type and a drift region of the first conductivity type. The drift region may be in contact with a drain region.

In the context of the present specification, the term "gate electrode" intends to describe an electrode which is situated next to, and configured to form and/or control a channel region. The term "gate electrode" shall embrace an electrode or conductive region which is situated next to, and insulated from the body region by an insulating region forming a gate dielectric region and configured to form and/or control a channel region through the body region by charging to an appropriate voltage.

Typically, the gate electrode is implemented as trench-gate electrode, i.e. as a gate electrode which is arranged in a trench extending from the main surface into the semiconductor substrate or body.

Typically, the semiconductor device is a power semiconductor device having an active area with a plurality of FET-cells (field-effect-transistor-cells such as MOSFET-cells, IGBT-cells and reverse conducting IGBT-cells, all of the former in the following generally also called "cells") for controlling a load current between two load metallization. Furthermore, the power semiconductor device may have a peripheral area with at least one edge-termination structure at least partially surrounding an active area of FET-cells when seen from above.

In the context of the present specification, the term "metallization" intends to describe a region or a layer with metallic or near metallic properties with respect to electric conductivity. A metallization may be in contact with a semiconductor region to form an electrode, a pad and/or a terminal of the semiconductor device. The metallization may be made of and/or comprise a metal such as Al, Ti, W, Cu, and Mo, or a metal alloy such as NiAl, but may also be made of a material with metallic or near metallic properties with respect to electric conductivity such as highly doped n-type or p-type poly-Si, TiN, an electrically conductive silicide such as $TaSi_2$, $TiSi_2$, PtSi, $WSi_2$, MoSi, or an electrically conductive carbide such as AlC, NiC, MoC, TiC, PtC, WC or the like. The metallization may also include different electrically conductive materials, for example a stack of those materials.

In the context of the present specification, the terms "in ohmic contact", in resistive electric contact" and "in resistive electric connection" intend to describe that there is an ohmic current path between respective elements or portions of a semiconductor device at least when no voltages or only low testing voltages are applied to and/or across the semiconductor device. Likewise, the terms in low ohmic contact, "in low resistive electric contact" and "in low resistive electric connection" intend to describe that there is a low resistive ohmic current path between respective elements or portions of a semiconductor device at least when no voltages are applied to and/or across the semiconductor device. Within this specification the terms "in low ohmic contact", "in low resistive electric contact", "electrically coupled", and "in low resistive electric connection" are used synonymously.

In the context of the present specification, the term "depletable region" or "depletable zone" is intended to describe the fact that the corresponding semiconductor region or the corresponding semiconductor zone is substantially fully depleted (substantially free of free charge carriers) during the off state of the semiconductor component with an applied reverse voltage lying above a given threshold value. For this purpose, the doping charge of the depletable region is set accordingly and, in one or more embodiments, the depletable region is a weakly doped region. In the off state, the depletable region(s) form depleted region(s), also referred to as space charge region(s), typically a contiguous depleted zone whereby the current flow between two electrodes or metallizations connected to the semiconductor body can be prevented.

In the context of the present specification, the term "semiconductor mesa" intends to describe one of typically several semiconductor portions or zones which extend from a common semiconductor substrate or a common semiconductor layer to or at least define a main surface of the semiconductor body or wafer and are spaced apart from each other. Typically, a semiconductor mesa is, in a vertical cross-section which is substantially orthogonal to the main surface, arranged between two adjacent trenches extending from the main surface into the semiconductor body or wafer. The trenches may be substantially vertical (vertical trenches), i.e. the side walls of the trenches and the semiconductor mesa, respectively, may, in the vertical cross-section, be substantially orthogonal to the main surface. In the vertical cross-section, the two side walls of a trench and a semiconductor mesa, respectively, may also be tapered. The terms "semiconductor mesa", "mesa regions" and "mesa" are used synonymously within this specification. In the following the two side walls of a trench and a semiconductor mesa, respectively, are also referred to as first side wall and second side wall.

Typically, the semiconductor device includes a plurality of semiconductor mesa which are spaced apart from each other by trenches and includes at least to semiconductor regions of opposite conductivity type which form a pn-junction which each other. More typically, each of the semiconductor mesas includes two pn-junctions (a first and a second one) which are arranged below each other and extend, in a vertical cross-section, between or at least to the first side wall and the second side wall. The trenches may at least in the active area include a bottom wall which extends between the respective first and second walls. The trenches typically also include conductive gate electrodes which are insulated from the common substrate and the adjacent mesa regions by respective dielectric layers forming gate dielectric regions at the sidewalls. Accordingly, a FET-structure is formed which is in the following also referred to as MesaFET-structure. Likewise, a vertical semiconductor device with such a MESAFET-structure is also referred to as MesaFET, for example as MesaMOSFET and MesaIGBT, respectively.

A unit cell of the active area of a power MesaFET may, in a horizontal cross-section, include a trench-gate electrode and a respective portion of two adjoining mesas when viewed from above. In these embodiments, trench-gate electrodes, mesas and unit cells may form respective one-dimensional lattices.

Alternatively, a unit cell of an active area of a MesaFET may, in a horizontal cross-section, include a trench-gate electrode and a surrounding portion of a mesa when the trench-gate electrodes form a two-dimensional lattice, for example in the form of a checker board, when viewed from above.

The term "power semiconductor device" as used in this specification intends to describe a semiconductor device on a single chip with high voltage and/or high current switching capabilities. In other words, power semiconductor devices are intended for high current, typically in the Ampere range and/or high voltages, typically above about 30 V, more typically above about 100 V, even more typically above about 400 V.

The term "edge-termination structure" as used in this specification intends to describe a structure that provides a transition region in which the high electric fields around an active area of the semiconductor device change gradually to the potential at or close to the edge of the device and/or between a reference potential such as ground and a high voltage e.g. at the edge and/or backside of the semiconductor device. The edge-termination structure may, for example, lower the field intensity around a termination region of a rectifying junction by spreading the electric field lines across the termination region.

In the following, embodiments pertaining to semiconductor devices and manufacturing methods for forming semiconductor devices are explained mainly with reference to silicon (Si) semiconductor devices having a monocrystalline Si semiconductor body. Accordingly, a semiconductor region or layer is typically a monocrystalline Si-region or Si-layer if not stated otherwise.

It should, however, be understood that the semiconductor body can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaP), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body is made of a wide band-gap material, i.e. of a semiconductor material with a band-gap of at least about two electron volts such as SiC or GaN and having a high breakdown field strength and high critical avalanche field strength, respectively, the doping of the respective semiconductor regions can be chosen higher which reduces the on-state resistance $R_{on}$.

Generally, embodiments of the invention pertain to a temperature protected power semiconductor device. It is a field effect controlled power device and allows for an inherent self-turn-off during a short circuit, or because of other high thermal load conditions. In this way, the short circuit withstand time of the power semiconductor device itself can be reduced down to about 1 µs or below. This in turn allows for a design having increased transconductance for a load current, leading to a reduction of device losses. Embodiments of the invention have the effect of reducing overall system costs, as the demands to an external short circuit detection and related device turn-off—other than the systems and mechanisms according to embodiments—can be significantly lowered, or in some cases those conventional protection systems and devices may be abandoned entirely. Generally, in embodiments, the power field effect transistor which is temperature protected may be of a vertical type or of a planar type, such as an IGBT with planar electrodes.

As used herein, the term "power semiconductor device" or "field effect controlled semiconductor device" relate to semiconductor devices in general which are controlled by a field effect. This includes FETs, in particular MISFETs, and IGBTs. As used herein, the terms "first terminal" in this context refer to a terminal of such a device, or of a cell thereof, which is by definition a source terminal in the context of a MISFET, and an emitter in the case of an IGBT. The term "second terminal" in this context refers to a terminal of such a device, or of a cell thereof, which is by definition a drain terminal in the context of a MISFET, and a collector in the case of an IGBT. In the following, when it is exemplarily referred to a "source", it is understood that this might also be the "emitter" of an IGBT, and where it is referred to a "drain", it is understood that this might also be the "collector" of an IGBT.

Generally, in embodiments a thermosensitive element is integrated into a field effect controlled power semiconductor device. The thermosensitive element interconnects gate and source of the power semiconductor device very fast after, for example, a short circuit event occurs. Thus, no time and cost consuming external detection for short circuit with subsequent externally triggered turn-off is required. This is achieved by connecting the first terminal (e.g. the source terminal) and the gate terminal of the power semiconductor device to the typically two contacts of the thermosensitive element. In embodiments, these thermosensitive elements may be provided for each cell of the power semiconductor device, or for groups of cells, and the thermosensitive element(s) are each connected in parallel to the gate and a first terminal of a cell, or a group of cells, of the power semiconductor device. The gate voltage is thus reduced when undesirably high temperatures occur, in extreme cases the gate is short-circuited to the first terminal (e.g. source) via the thermosensitive element. On the basis of the locally (in one cell) or globally (in all cells) reduced gate voltage, the channel resistance of the affected cell or the affected cell group is enhanced, which leads to a locally limited reduction of the load current and thus to a more homogeneous load distribution of the power semiconductor device as a whole.

In the case of thermal overload, for example if a short circuit occurs, the short circuit current is in embodiments reduced due to a lowered channel conductance caused by the influence of the thermosensitive element via the gate. Hence, the load current is limited to a value which each—depending on the concrete design of the power semiconductor device—chip, cell or cell group can carry. Even in parallel circuits with relatively high parasitic capacitance between the individual chips, a local specific reduction of load current in the overheated chip(s) or cell(s) can be achieved. In case of an external short circuit, an automated complete shut down can automatically be achieved for the entire power semiconductor device.

In practical use of embodiments of the invention, there may be a trade-off or compromise between ease of production, cost etc. on the one hand, and a placement of the thermosensitive element as close as possible to the heat producing zone on the other hand. Thus, a thermosensitive element may in practical use of embodiments of the invention be placed in a moderately greater distance to a heat producing zone than what might be technically possible and also desirable, due to a minimized time for the heat transfer from the heat producing zone to the bipolar junction transistor—but would at the same time cause higher production costs, additional production steps, or the like.

Generally, embodiments described herein may be employed to provide power semiconductor devices which do not need a conventional detection of the operating state, for example via an extra temperature sensor. However, in embodiments it may be helpful to also implement such a supervision and to thereby detect the thermal operating state, which can also be used for displaying an overload condition to a human operator or to a surveillance software. It may also be used to additionally turn off a gate driver of the power semiconductor device when an overload or overheating is detected. However, as the primary near-real-time protection against overload, short circuit or generally overheating is provided by the thermosensitive element disclosed herein, an additional external protection via the gate driver may be carried out with a time delay of several µs or even several 10 µs, such as 20 µs, 30 µs or 40 µs. This helps to reduce cost, as the requirements for the switching behavior of the external protection circuit including the gate driver are thus lower than what is needed for conventional power semiconductor devices.

In some embodiments described herein, the thermosensitive element is a bipolar junction transistor with an open base, meaning the base is not electrically connected to any potential nor to ground. The source and emitter terminals of the bipolar junction transistor with the open—or differently expressed: floating—base are connected to the first terminal (typically: the source terminal) and the gate electrode of the power field effect transistor. The bipolar junction transistor is thereby located as closely as possible to the location where the heat production of the power semiconductor device during short circuit or other extreme thermal load conditions has a maximum value. The purpose of minimizing the distance of the bipolar junction transistor to the heat producing area of the power semiconductor device is to minimize the time after which the produced heat has reached the bipolar junction transistor through heat conduction through the semiconductor material. Thus, a placement of the bipolar junction transistor, or put more generally, of the thermosensitive element, in close vicinity to the heat producing zone is desirable for achieving a switch-off time after a short circuit event or other abnormal thermal event as short as possible.

In further embodiments described herein, the thermosensitive element is provided as at least one Zener diode, typically as a serial arrangement of a plurality of Zener diodes. The Zener diode or serial arrangement of Zener diodes is connected to the gate with a first contact, and to a first terminal of the power field effect transistor with a second contact. The internal resistance of the Zener diode(s) is thereby designed to have a similar or lower resistance than the diffusion resistance of the gate potential on the chip, or of the cell or group of cells. Even a dispersion of the cut-off threshold in the chip or chips in parallel can be avoided with an appropriate design of the Zener diodes, because each cell, cell group or chip (area) can be operated at its maximum temperature, and hence at its maximum current and power limit. In this manner, in some embodiments inherently short-circuit proof IGBT modules with many parallel IGBTs are provided.

In embodiments, the doping of the Zener diodes is chosen so as to provide a negative temperature coefficient. Because of this, the breakdown voltage of the Zener diodes is typically below 4.5 V, and in typical embodiments, at least four Zener diodes are connected in series. Due to the low requirements with respect to reverse voltage, such Zener diodes can be realized in relatively small areas of the semiconductor substrate adjacent to the power field effect transistor.

In FIG. 1, the general underlying principle of all embodiments as described herein is shown. A capacitor 10 represents the gate-source capacitance of the power semiconductor device (not shown in FIG. 1) which is temperature protected, the capacitance being generally present in field effect controlled power semiconductor devices. The gate-source capacitance is charged and discharged in order to influence the transconductance of the channel of the field effect controlled power semiconductor device during operation of the same. The thermosensitive element 60 is connected with two contacts 62, 64 parallel to the gate source capacitance 10. During a condition which requires protection, the voltage drop across the impedance $R_z$ of the thermosensitive element 60 needs to be well below the voltage drop across the gate, which is symbolized by the resistor $R_g$ 28, so that the resulting voltage across the gate-source capacitance is below the threshold voltage of the field effect power semiconductor device.

In the following, embodiments including thermosensitive elements employing at least one bipolar junction transistor are described. The laid out principles are explained mainly while considering that the bipolar junction transistor is of a pnp type, without thereby excluding the npn variant from the use in embodiments of the invention.

Figure 2:
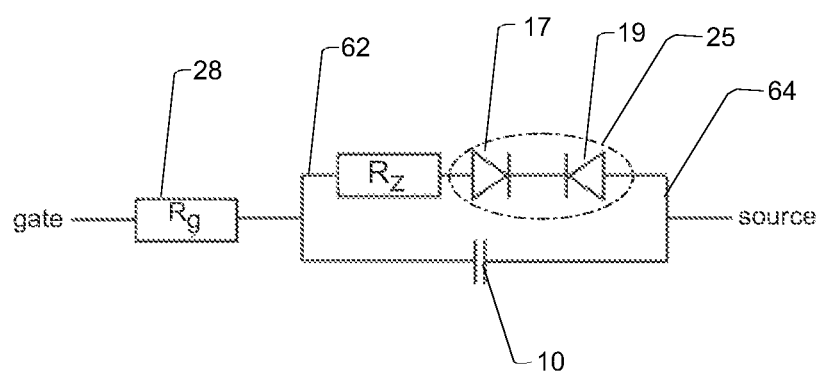
FIG. 2 shows an equivalent circuit according to further embodiments of the invention.

In embodiments, the n-doped base is freely floating. Thus, the bipolar junction transistor is nothing else than two opposing diodes 17, 19 which is shown in FIG. 2. The breakdown voltage of such a structure proves to be strongly temperature dependent, (see FIG. 3, from: M. Reisch, On Bistable Behavior and Open-Base Breakdown of Bipolar Transistors in the Avalanche Regime-Modeling and Applications, TED, Vol. 39, No. 6, 1992) of which use is made in embodiments.

In FIG. 2, the capacitor 10 represents the gate-source capacitance as is it generally present in field effect power semiconductor devices, which is charged and discharged in order to open the channel of the field effect controlled power semiconductor device. The two opposing diodes 17, 19 represent an open-base bipolar junction transistor 25, having in this embodiment the function of the thermosensitive element 60 of FIG. 1. It has a sufficient blocking capability during operation, which can be easily achieved by choosing appropriate doped semiconductor materials and geometries. During short circuit and subsequent overheating, the voltage drop across the bipolar junction transistor 25 needs to be well below the voltage drop across the gate, which is symbolized by the resistor $R_g$ 28, so that the voltage across the gate-source capacitance 10 is below the threshold voltage of the field effect power semiconductor device, which is in FIG. 2 only represented by its source and gate terminals.

Figure 3:
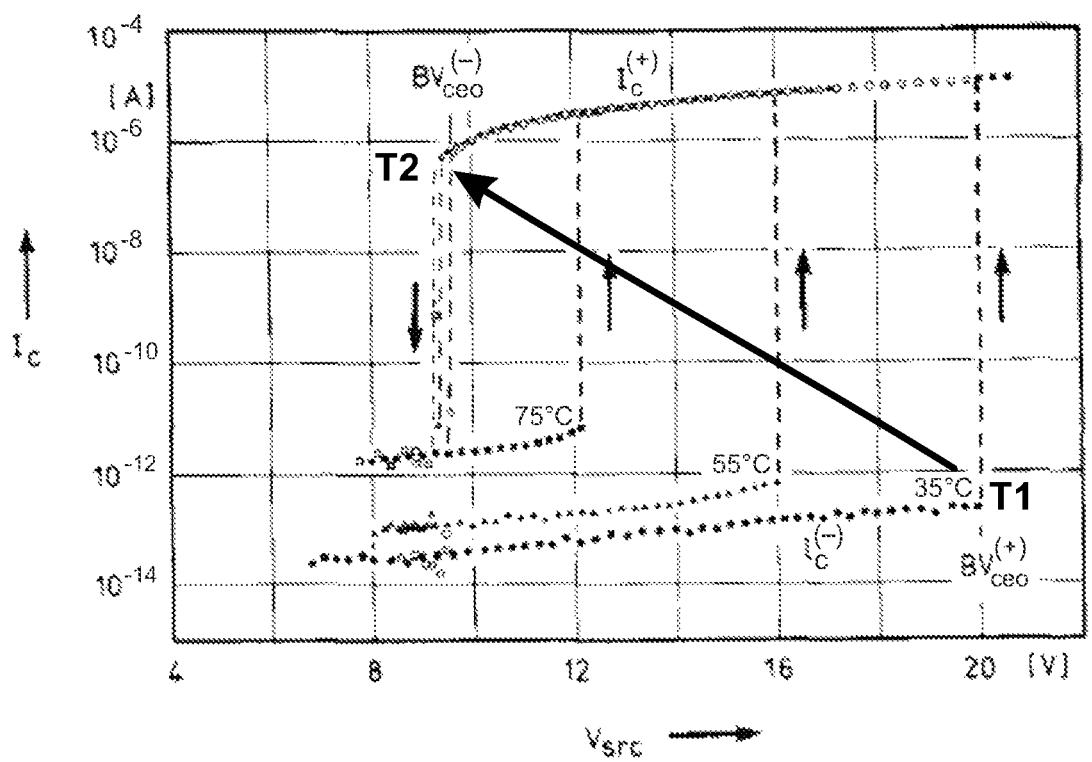
FIG. 3 is a diagram showing the characteristics of a thermosensitive element according to embodiments.

As soon as the temperature during a short circuit condition rises from T1 to T2 as shown exemplarily in FIG. 3, the generation current and the carrier lifetime of free charge carriers in the base and with it the partial transistor gain increases tremendously, as the charge carrier density n in the base of the bipolar junction transistor 25 rises exponentially with temperature and the recombination decreases. The temperature dependence of n is described by the following equation: $n \sim e^{-Eg/2kT}$.

In this manner, according to embodiments the breakdown or blocking voltage is reduced as indicated by the starting point T1 and end point T2 of the vector in FIG. 3. By choosing the characteristic dimensions of the bipolar junction transistor properly, such as a base width, emitter efficiency, carrier lifetime and its temperature dependence and the like, the temperatures T1 and T2 can be adjusted such that the typical temperatures of normal operation and of a short circuit condition lead to breakdown voltages of the bipolar junction transistor above (normal operation) and below (short circuit condition or overheating in general) the threshold voltage of the field effect controlled power semiconductor device, respectively. I.e., as soon as the temperature of the bipolar junction transistor exceeds the critical temperature T2, the voltage across the source and emitter terminals of the bipolar junction transistor, and hence the voltage across the source and gate terminals of the field effect controlled power device, drops below the threshold voltage of the latter, leading to the turn-off of the power semiconductor device during short circuit condition or overheating, and hence prevent the device, or at least, a respective cell or group of cells thereof, from destruction.

In addition, in embodiments the proposed structure can be used to optically turn-off an IGBT, as the generation current in the bipolar junction transistor base can be strongly enhanced by means of optical coupling, such as e.g. described in EP 0353509 A1, col. 4, line 20 to col. 6, line 40, and EP 1237197 A2, col. 3, line 45 to col. 5, Line 48, the respective teachings of which are herein incorporated by reference. Moreover, the temperature induced or light induced current through the bipolar junction transistor can be used as an additional trigger for the external driver to turn-off the field effect controlled power semiconductor device.

Hence, in some embodiments a field effect controlled power semiconductor device includes at least one bipolar junction transistor (BJT) with an open base, which has a decreasing blocking capability with increasing temperature. As a result, the gate voltage of at least one cell of the field effect controlled power semiconductor device is reduced at undesirably high temperatures and, in extreme cases characterized by high temperatures, the gate-source-path is shortcut by the bipolar junction transistor. Thereby, the bipolar junction transistor passes charge from the gate to the source, and the channel resistance of the affected cell or the affected cells is enhanced. A single dedicated bipolar junction transistor as a temperature protection as described herein may in embodiments be provided for each cell in the power semiconductor device, or may be provided for groups of cells, or also for the entire power semiconductor device. In the case of one dedicated bipolar junction transistor for each cell, also a local overheating of a single cell will lead to a higher resistance and thus to a load decrease of the singular cell which is overheated, resulting in a load balancing in the plurality of cells of the power semiconductor device.

In case of an overheating of a chip of the power semiconductor device, wherein the chip includes a plurality of cells, the individual load current of the chip is limited to the load current which the chip can carry. In extreme load conditions such as short circuit, typically all chips are switched off entirely by the bipolar junction transistors dedicated to each chip. Even in parallel circuits with relatively high parasitic capacitances between the individual chips, the current can thus be safely shut down automatically for each chip. Hence, even in massively parallel circuits, embodiments of the invention provide an inherently short-circuit proof power switch, which works internally without requirement for any engagement of the gate control circuit. In embodiments, the power semiconductor device may, however, be adapted such that in case of an overheating, additionally to the temperature protection by means of the bipolar junction transistor(s) as described, the driving circuit for the gate also switches to a reduced load current.

In embodiments, a local reduction of the gate voltage by the protection element may be enhanced in that the gate supply line to each cell, each cell strip, or to each transistor element having such a protection device between its gate and source, has an internal resistance that is greater than the internal resistance of the protection device, i.e. the bipolar junction transistor.

Figure 4:
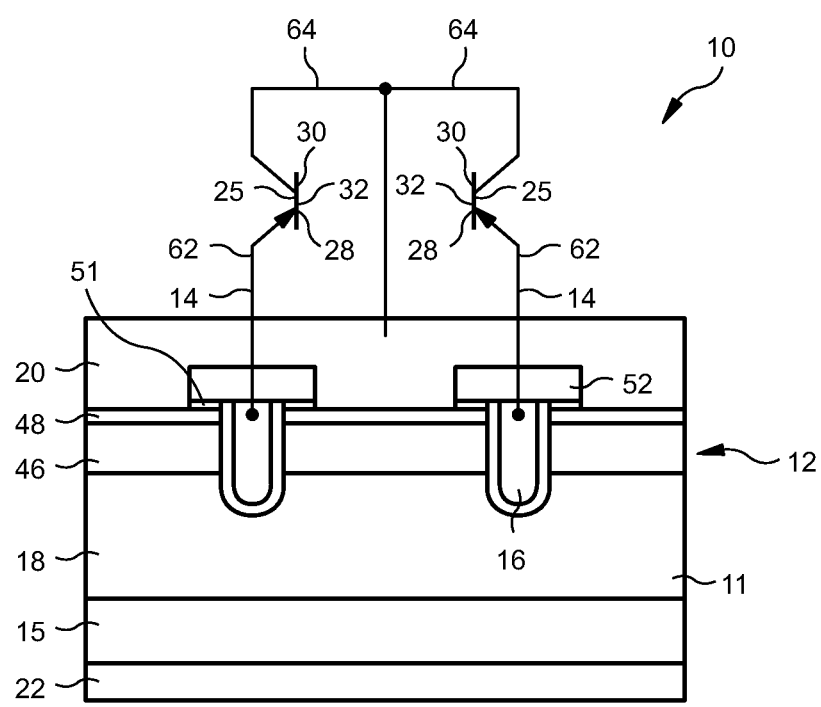
FIG. 4 is a schematic view of a power semiconductor device according to embodiments.

In FIG. 4, an exemplary power semiconductor device 10 according to embodiments is shown. It comprises at least one power field effect transistor 12. In the figure, two power field effect transistors are shown as a non-limiting example, which are provided in a substrate 11. Each of the power field effect transistors 12 has a gate electrode 14 connected to a gate 16, a drift region 18, and a first terminal 20 and a second terminal 22 for a load current. In the example shown, the first terminal 20 is the source metallization, and the second terminal 22 is the drain metallization. Further, a body contact 48 is provided, a body 46, a source 51, a drain 15, and a gate isolation 52. The load current between the first terminal 20 and the second terminal 22 can be controlled during operation by a voltage applied between the gate 16 and the first terminal 20. In other figures described herein, not all of the details described above are necessarily repeated in the description of embodiments, though present therein as well.

The power semiconductor device 10 of FIG. 4 further comprises one bipolar junction transistor 25 (which in the non-limiting example shown is a pnp type) for each of the two power field effect transistors 12. The bipolar junction transistors 25 are only symbolically shown in FIG. 4 and each have an emitter 28, a collector 30, and a base 32. As is shown, the emitter is connected to the gate electrode 14 of the power field effect transistor 12. The collector is connected to the first terminal 20 of the power field effect transistor 12, which is the source metallization. The base 32 is electrically open.

The bipolar junction transistors 25 are integrated (not shown for illustrational purposes, see for example FIG. 6) in the same substrate 11 as the power field effect transistors 12 and are thermally connected to them. The bipolar junction transistor 25 is adapted, as was described further above, such that it causes the power field effect transistor 12 to reduce a load current in case of an exceedance of a limit temperature of the power field effect transistor 12. To this end, the gate 16 and the first terminal 20 are electrically interconnected by the bipolar junction transistor 25 when a defined temperature is reached.

Figure 5:
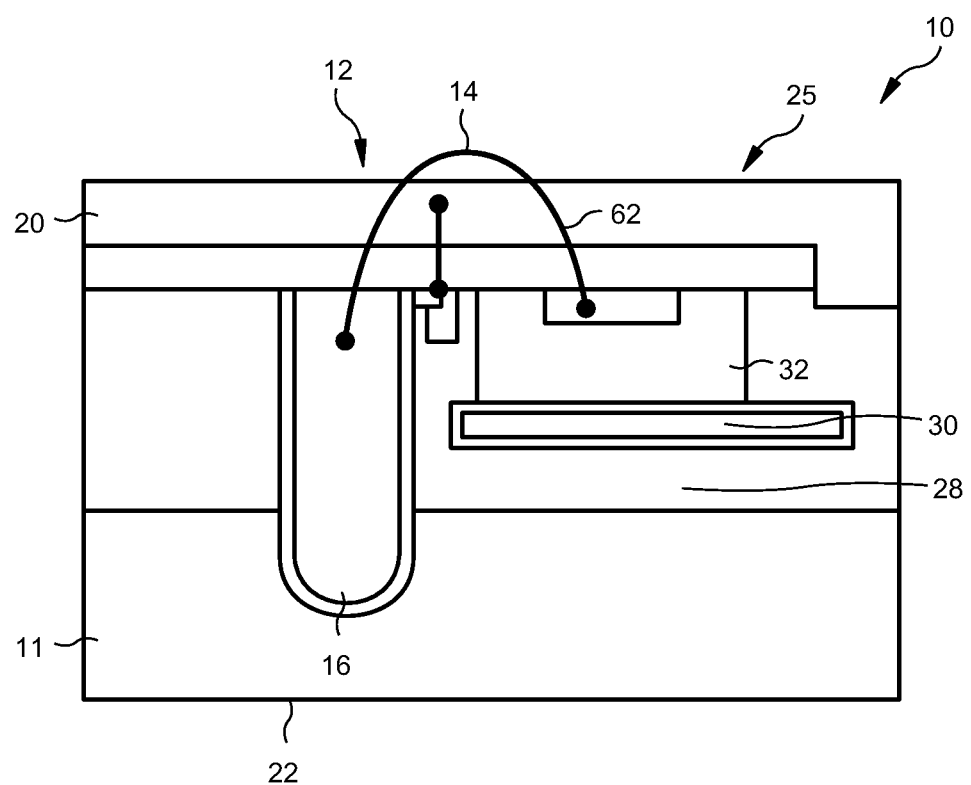
FIG. 5 is a cross sectional view of a power semiconductor device according to embodiments.

FIG. 5 shows a more detailed view of the power semiconductor device 10 of FIG. 4. Therein, it is shown how the bipolar junction transistor 25 is integrated in the same substrate 11 as the power field effect transistor 12. The emitter 28 of the bipolar junction transistor 25 is realized as a p-well, which is in contact with the first terminal 20 of the power field effect transistor 12. The collector 32 is connected to the gate 16 via the gate electrode 14, the open base 30 is realized as a n-doped well.

As was described further above, the bipolar junction transistor 25 serves as a temperature protection for the power field effect transistor 12. When the temperature of the bipolar junction transistor exceeds a critical, predefined temperature T2, the voltage across the collector 32 and emitter 28 of the bipolar junction transistor, and hence the voltage across the first terminal 20 (here: source) and gate electrode 14 of the power field effect transistor 12, drops below the threshold voltage of the power field effect transistor 12. This leads to a turn-off of the power semiconductor device, or at least—depending on the specific design of the bipolar junction transistor 25—a significant reduction of the load current. The exceeding of the temperature T2 in the bipolar junction transistor is thereby typically caused by a short circuit condition of the power field effect transistor 12, or by a general overheating condition due to other causes. The latter may for example be caused by a defect of an external cooling of the power semiconductor device 10 or other failure sources. However, regardless of the source of an overheating of the power field effect transistor 12, the produced heat is transmitted via heat conduction to the bipolar junction transistor, and hence prevents the power semiconductor device 10 from destruction.

Thereby, the collector current of the bipolar junction transistor is fed in embodiments from the gate voltage of the power field effect transistor 12. In order to achieve the desired strong rise of the collector current when reaching the defined temperature T2 (critical temperature at which the bipolar junction transistor switches), the current amplification of the open-base bipolar junction transistor 25 should be high enough, that is, the dopant concentration of the emitter 28 is chosen significantly higher than the dopant concentration of the floating (or open) base 30. Hence, for the pnp bipolar junction transistor as shown in FIG. 5, it is advantageous to have an enhanced p-dopant concentration below the basis 30 realized as an n-well. Below that n-well, a sufficiently high p-dopant concentration is necessary in order to achieve a highside-suitability of the power semiconductor device 10. Flowing holes caused by a dU/dt of the power field effect transistor 12 have to be guided with low resistivity to a source 20, respectively to a reference potential. Also for this purpose, the buried, enhanced p-doping of the emitter 28 is advantageous.

In embodiments, the temperature detection according to embodiments may be combined with a conventional temperature detection, or overload detection mechanism, which typically acts on the gate voltage. Due to the very fast response time of the protection according to embodiments, which is in the range of 1 μs or below, the conventional protection can be designed to have a significantly slower response time, e.g. in the order of some μs or even up to 10 μs or several 10 μs.

As was described, the temperature protection of a power semiconductor device 10 according to embodiments is based on the targeted, local reduction of the gate 16 voltage in overheated regions of the power semiconductor device 10. This is generally achieved by integrating an element, typically a bipolar junction transistor 25, which has a negative temperature coefficient of the blocking voltage, which element is electrically connected to the local gate electrode 14 and the reference potential (first terminal 20).

It is understood that the reaction time of the temperature protection according to embodiments generally becomes smaller when the bipolar junction transistor 25 is located closer to the zone where the largest amount of heat is produced in the power field effect transistor 12. Thus, when designing a temperature protected power semiconductor device 10 as described herein, this should be taken into account.

It goes without saying that the optimal positioning of the bipolar junction transistor 25 is strongly dependent on the desired switching behavior of the temperature protection and the individual design, geometrical properties and materials of the power semiconductor device 10 as a whole. Suitable parameters may be achieved for specific realizations, for example, by way of well-known numerical simulation methods or by experimentation.

Figure 6:
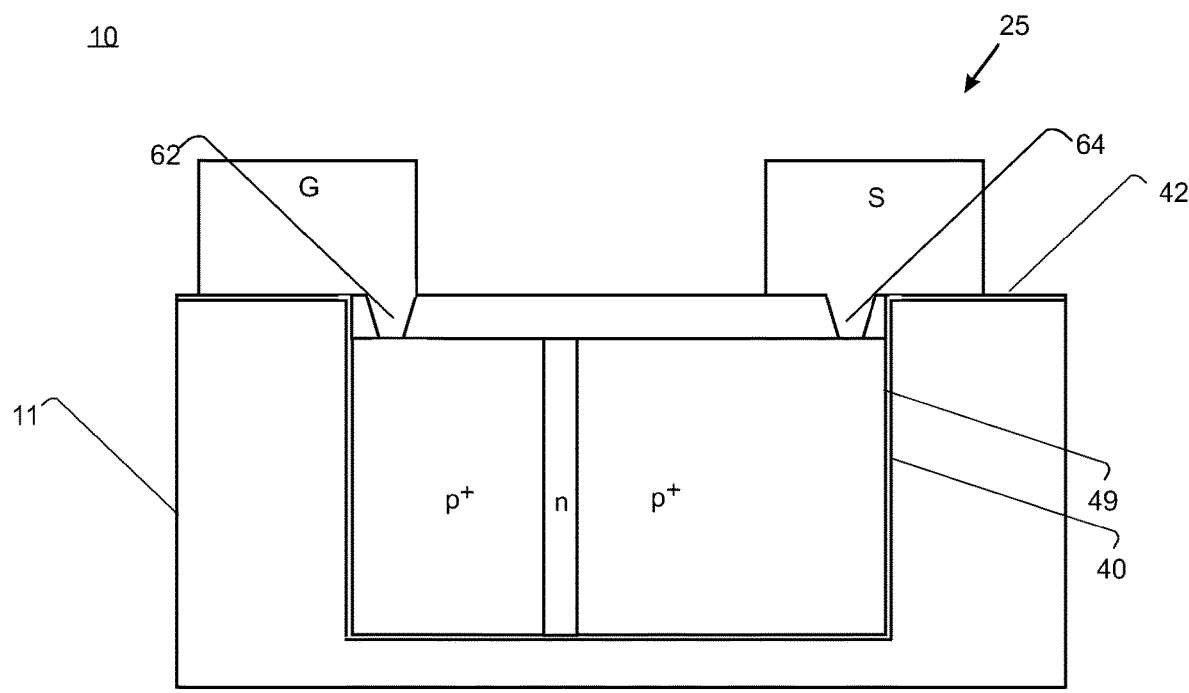
FIGS. 6 to 13 are cross sectional partial views of power semiconductor devices according to embodiments.
Figure 7:
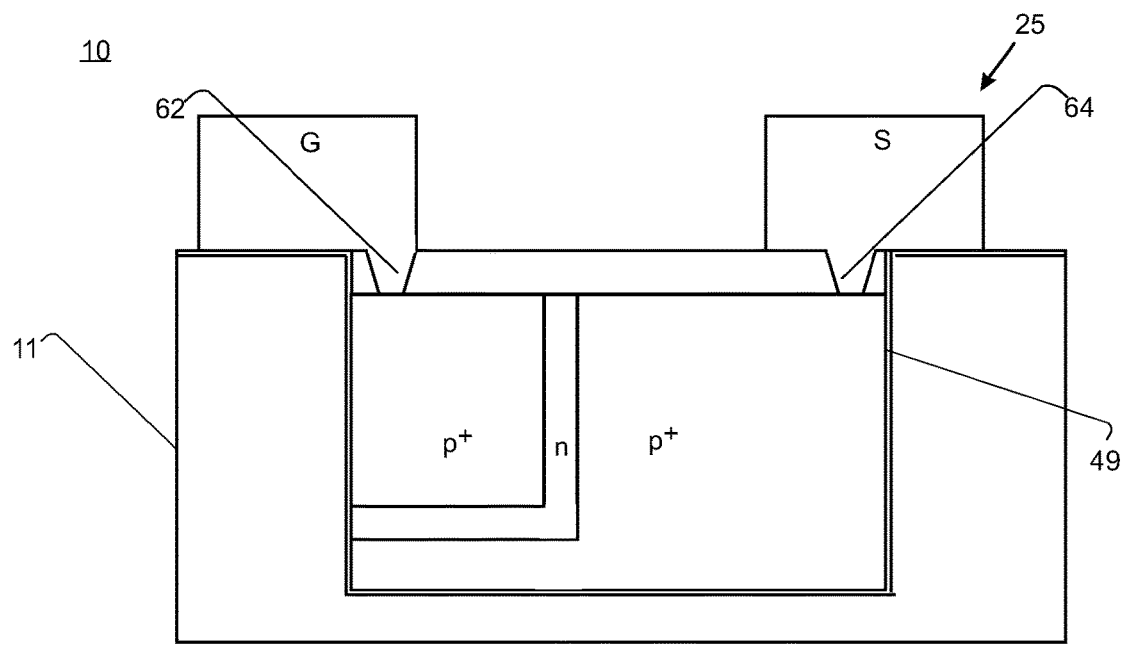
Figure 8:
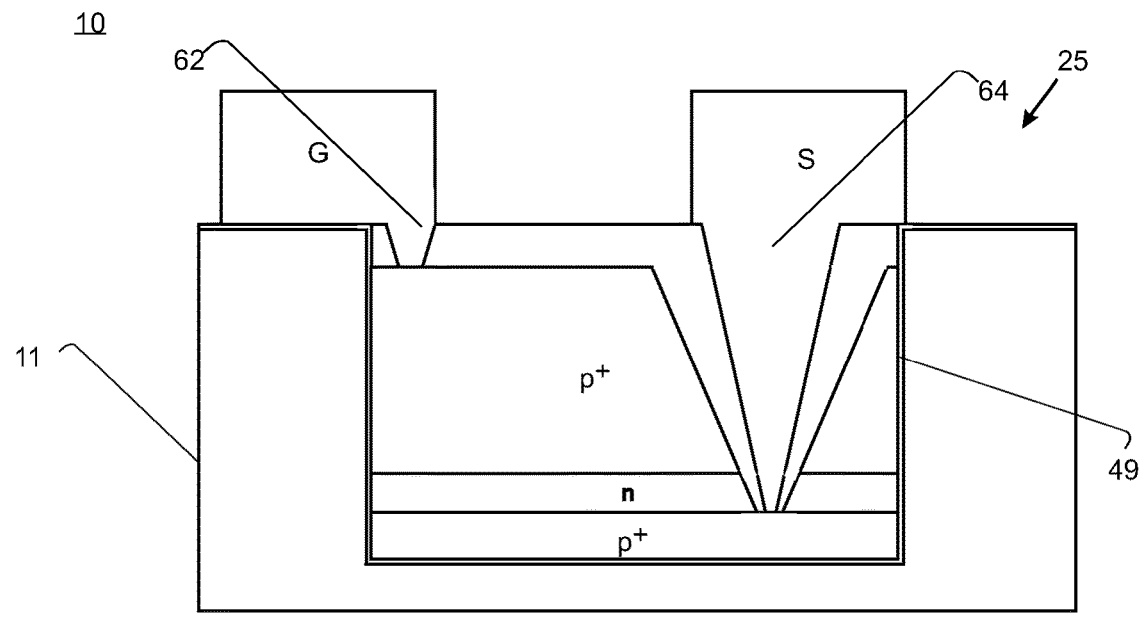
Figure 9:
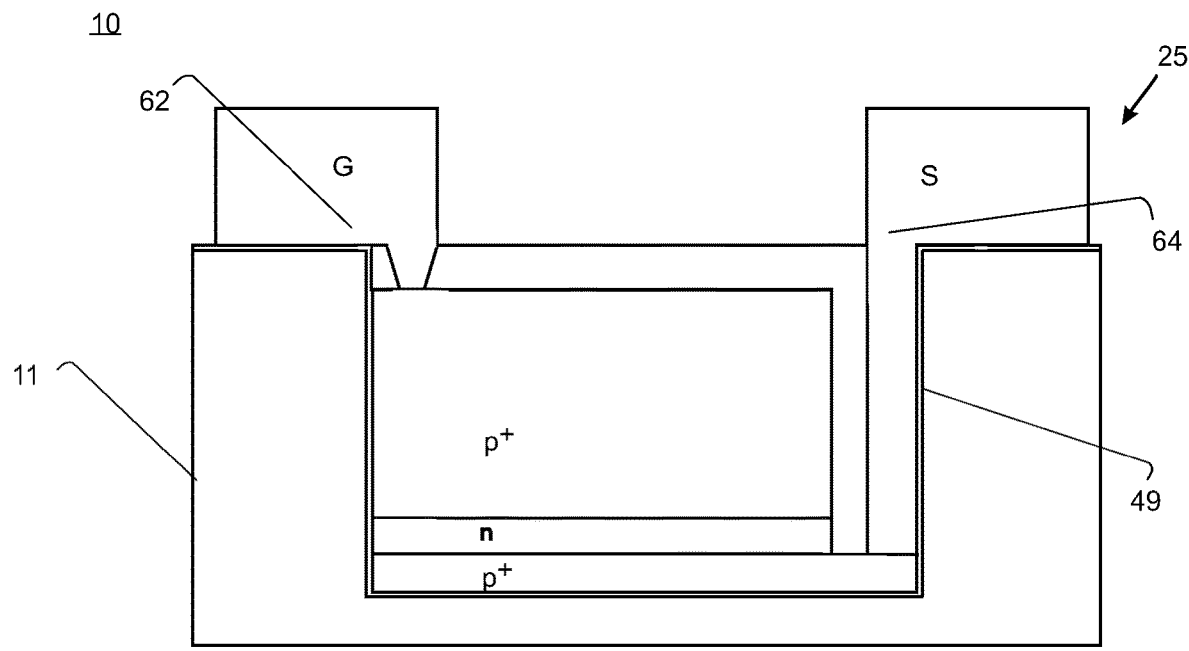
Figure 10:
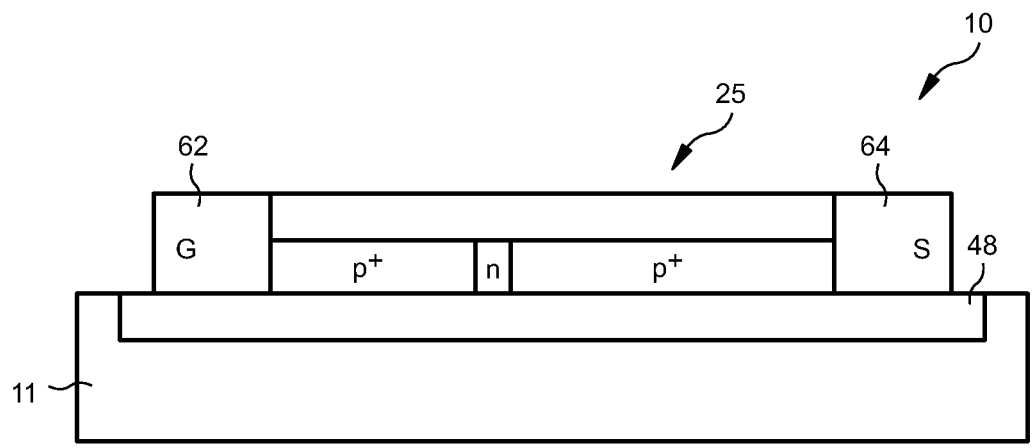

FIGS. 7 to 14 each show variants of bipolar junction transistors 25, 26 integrated with a substrate 11 of a power semiconductor device 10 according to embodiments. Thereby, the power field effect transistors 12 also integrated in the same substrate 11, such as described with respect to FIGS. 4 to 6, are omitted in FIGS. 7 to 14 for illustrational purposes. The bipolar junction transistors 25, 26 shown are connected with contacts 62, 64 to the power field effect transistor 12 (not shown), the connections being also indicated by G and S for "gate" and "source" of the power field effect transistor, respectively. Thus, with respect to the terminology used in FIGS. 4 to 6, S is connected to the first terminal 20 and G is connected to the gate electrode 14, both of the power field effect transistor 12.

In the FIGS. 7 to 10, 13 and 14, the bipolar junction transistor 25, 26 is provided in a trench 40, 50 in the surface 42 of the substrate 11. The n-layers and p-layers are provided in a trench 40, 50, isolated from the rest of the substrate 11 by a second isolation layer 49.

Figure 11:
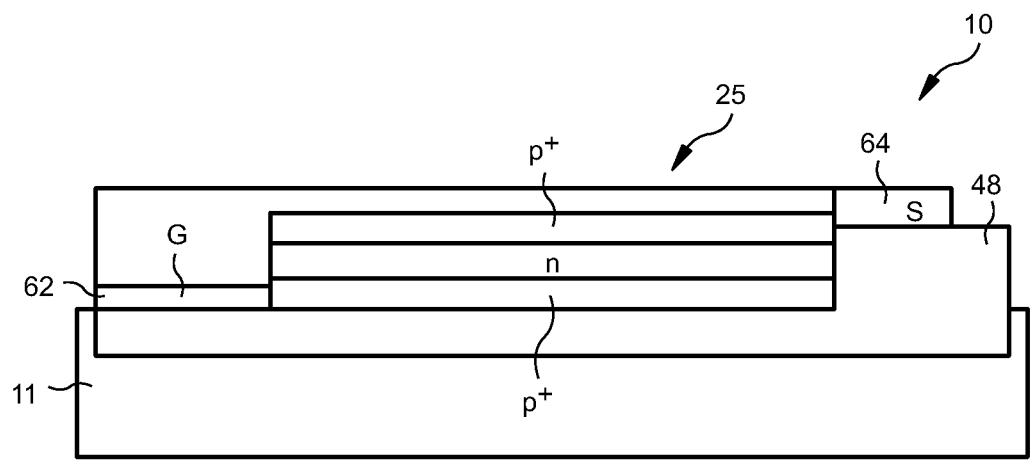
Figure 12:
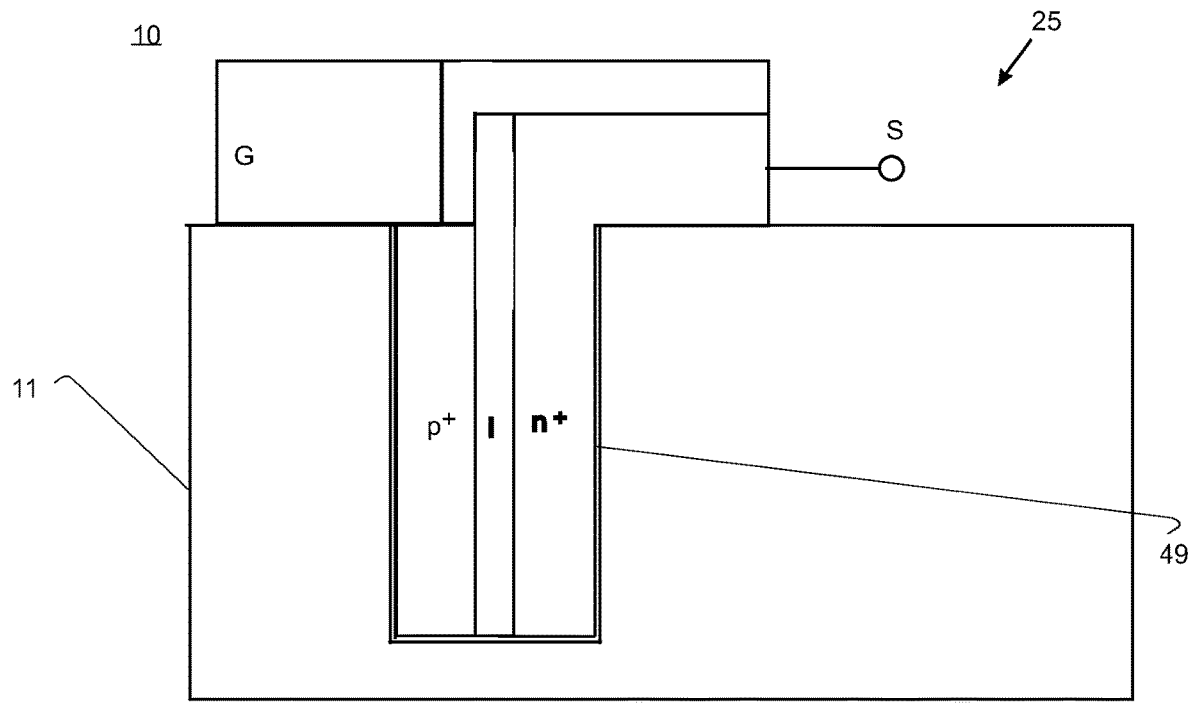
Figure 13:
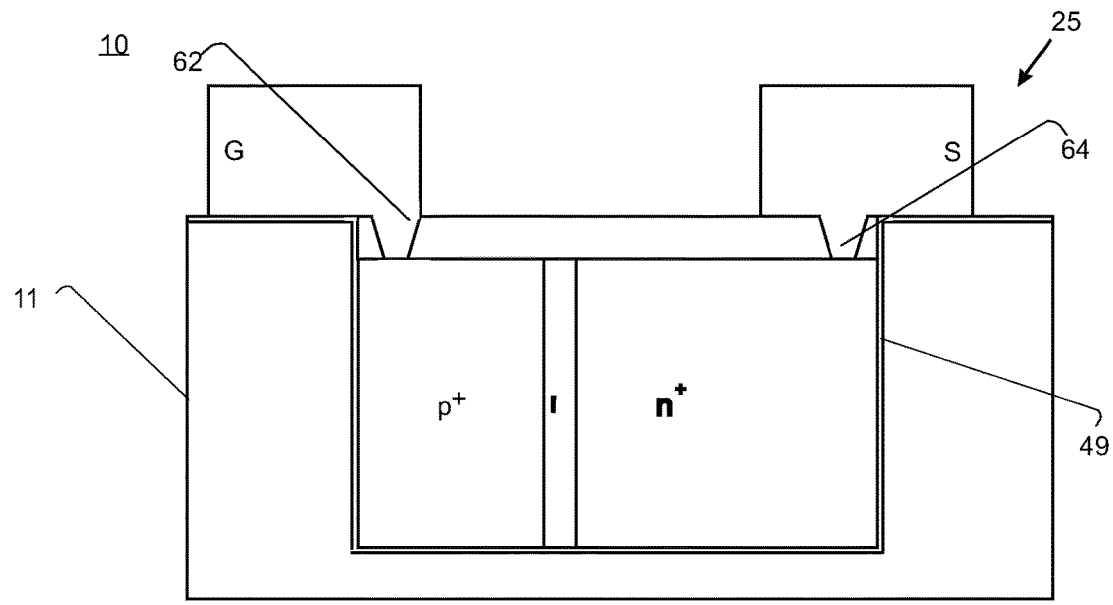

In FIGS. 11 and 12, variants according to embodiments are shown, wherein the bipolar junction transistor 25, 26 is provided in the vicinity of the surface of the substrate 11, e.g. wherein the n-layer and p-layer are provided directly on an isolation layer 48 on the surface 42.

It is understood that bipolar junction transistors can in embodiments also be located on a side of the substrate where the drain metallization is provided, wherein the examples explained above refer—in a non-limiting manner only—to the source metallization side.

Figure 14:
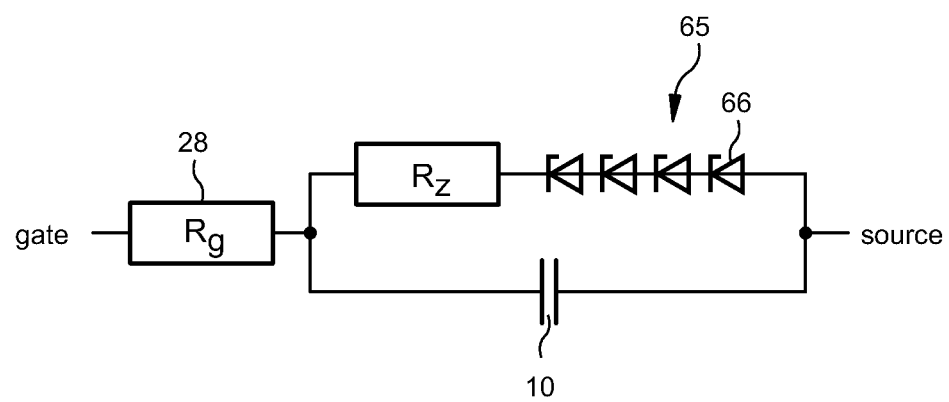
FIG. 14 shows an equivalent circuit according to further embodiments of the invention.

In FIG. 14, the thermosensitve element comprises a serial connection of Zener diodes 65 including, as a non-limiting example for illustrational purposes, four Zener diodes 66. A negative temperature coefficient of the Zener voltage of the Zener diodes 66 is provided to achieve the desired temperature-dependent switching behavior as extensively described further above. The Zener diodes have typically a Zener voltage of not more than 4.5 V each, measured at room temperature, in order to achieve the desired negative temperature coefficient K. In case the application requires negative gate voltages, an appropriate number of anti-serial Zener-diodes needs to be added (not indicated in FIG. 15).

The temperature coefficient K of the Zener diodes 65 is defined as:

$$K = \frac{1}{U_z} \cdot \frac{dU_z}{dT} \text{ at } I_d = const.$$

Wherein typical values are $U_z = 3.3 V \rightarrow k = -6 \cdot 10^{-4} K^{-1}$ and $U_z \approx 5.1 \ V \rightarrow k = 0.$ For smaller Zener voltages $U_z$ the Parameter k becomes more negative.

Figure 15:
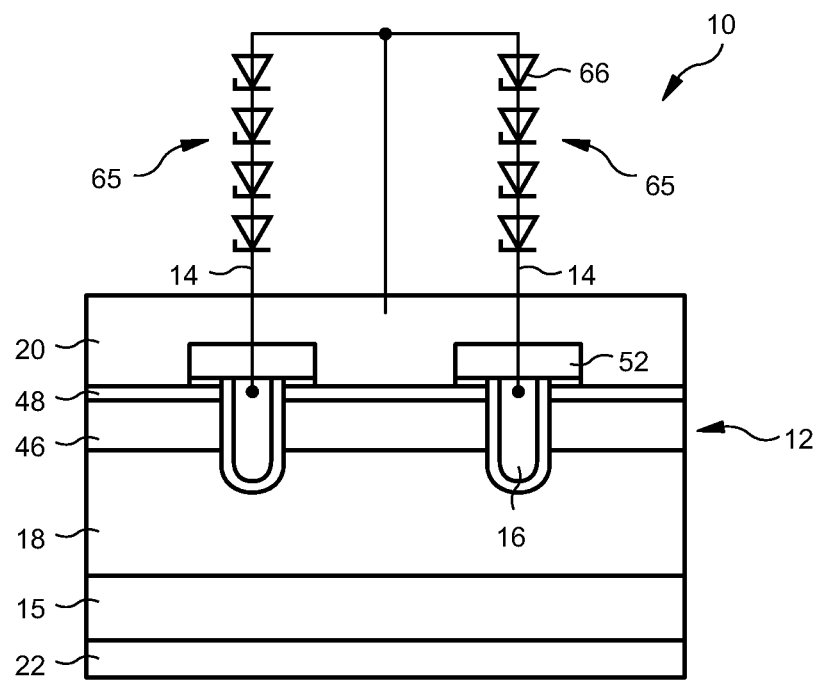
FIG. 15 is a schematic cross sectional view of a power semiconductor device according to embodiments.

FIG. 15 schematically shows a MOSFET semiconductor power device 10 with two transistors 12, each having a temperature protection as described with respect to FIG. 14. The serial connection of Zener diodes 65 is connected to the gate electrode 14 and to a first terminal 20 of the power field effect transistors 12. For a more detailed description of the power field effect transistor 12, refer to FIG. 4, for example.

Figure 16:
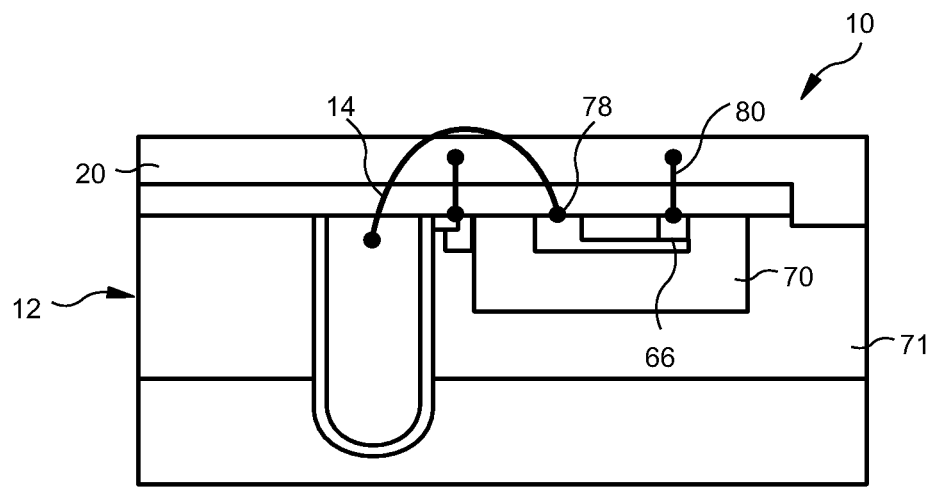
FIG. 16 is a schematic cross sectional view of a power semiconductor device according to embodiments.

FIG. 16 shows how a Zener diode 66 may be provided with respect to a power field effect transistor 12, according to embodiments. The single Zener diodes 66 of the serial connection of Zener diodes 65 have to be isolated against each other and be isolated with respect to the drain. This may for example be carried out by isolation via separated n-wells 70 located in a deeper p-well 71, located as an example in the body region. In the n-wells, the doped areas of the Zener diodes 66 are realized. In the cross section shown, only one Zener diode 66 is depicted. Other Zener diodes 66 of the serial connection of Zener diodes 65 of FIG. 15 can be regarded to be located behind and in front of the drawing plane on an axis perpendicular to the drawing plane.

Figure 17:
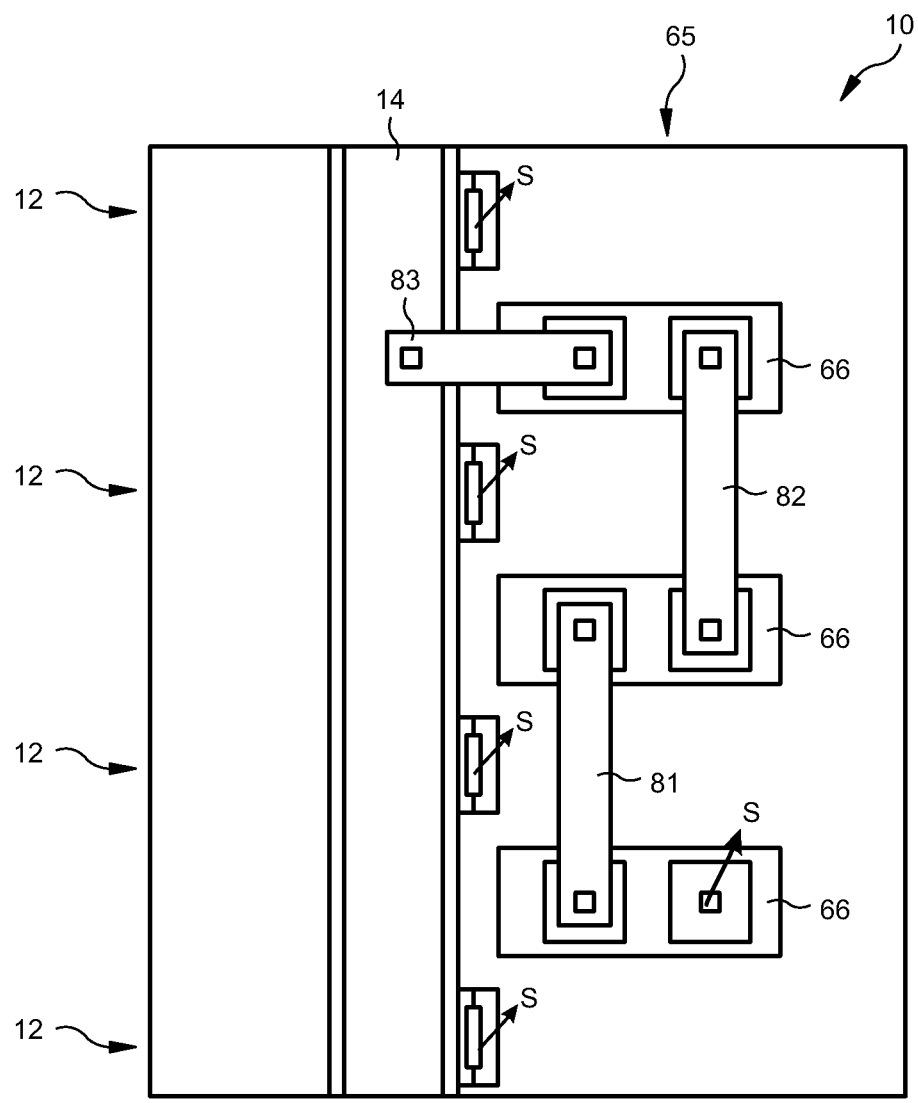
FIG. 17 is a schematic top view of a power semiconductor device according to embodiments.

FIG. 17 shows a top view of a temperature protected power semiconductor device 10 having four power field effect transistors 12. The temperature protection is provided by the serial connection of Zener diodes 65, wherein the diodes 66 are connected in series between the gate electrode 14 and the first terminal 20 (here: indicated as an arrow standing for the connection to source "S", or first terminal 20) by interconnections 81, 82, 83. Further body contacts are not shown in FIG. 17 for illustrational reasons, however for improving the suitability for highside-switching and the robustness of the Zener diodes 66, it can be advantageous to further increase the number of body contacts. Contacts between interconnections 81, 82, 83 and the respective structure below are shown as rectangles.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific Figures may be combined with features of other Figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the Figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A temperature protected power semiconductor device comprising a substrate, the substrate comprising:
    a power field effect transistor comprising a gate electrode connected to a gate, a drift region, and a first terminal and a second terminal for a load current, wherein the load current is controllable during operation by a voltage applied between the gate and the first terminal; and
    a thermosensitive element comprising first, second and third doped regions formed in the substrate, wherein the first doped region forms a p-n junction with the second doped region, wherein the second doped region forms a p-n junction with the third doped region, wherein the first doped region is directly conductively connected with the gate electrode, and wherein the third doped region is directly conductively connected with the first terminal,
    wherein the thermosensitive element is thermally coupled to the power field effect transistor,
    wherein the thermosensitive element is configured to cause the power field effect transistor to reduce the load current in case of an exceedance of a limit temperature of the power field effect transistor by interconnecting the gate and the first terminal via conduction across the first, second and third doped regions of the thermosensitive element.

2. The temperature protected power semiconductor device of claim 1, wherein the thermosensitive element is a bipolar transistor having an emitter, a collector, and a base, wherein the first doped region is the collector, wherein the second doped region is the base, and wherein the third doped region is the emitter, and wherein the base is electrically open.

3. The temperature protected power semiconductor device of claim 2, wherein the bipolar transistor is configured such that, above the limit temperature, the voltage between the gate and the first terminal is pulled below a threshold voltage of the power field effect transistor.

4. The temperature protected power semiconductor device of claim 2, wherein the bipolar transistor is disposed in a trench in a surface of the substrate.

5. The temperature protected power semiconductor device of claim 4, wherein the surface of the substrate and a surface of the trench are covered with a first isolation layer.

6. The temperature protected power semiconductor device of claim 2, wherein the bipolar transistor is disposed adjacent to a surface of the substrate.

7. The temperature protected power semiconductor device of claim 6, wherein the bipolar transistor is isolated from the substrate by an isolation layer.

8. The temperature protected power semiconductor device of claim 2, wherein the bipolar transistor comprises one of: a horizontally oriented stack having at least one p-doped layer and at least one n-doped layer; and a vertically oriented stack having at least one p-doped layer and at least one n-doped layer.

9. The temperature protected power semiconductor device of claim 1, wherein a plurality of regularly distributed trenches are formed in the substrate.

10. The temperature protected power semiconductor device of claim 2, wherein a plurality of elongated trenches with bipolar transistors are formed in parallel in the substrate.

11. The temperature protected power semiconductor device of claim 1, wherein the power field effect transistor is one of: a FET; a Power MOSFET; and an IGBT.

12. The temperature protected power semiconductor device of claim 2, wherein the power semiconductor device is a vertical device, wherein the substrate comprises a front surface and a back surface, and wherein the bipolar transistor is provided adjacent to the front surface.

13. The temperature protected power semiconductor device of claim 1, wherein the first, second and third doped regions each extend to an upper surface of the substrate.

14. A method for producing a temperature protected power semiconductor device, the method comprising:
    providing a substrate;
    forming, in the substrate, a power field effect transistor comprising a gate electrode connected to a gate, a drift region, and a first terminal and a second terminal for a load current; and
    forming a thermosensitive element having a negative temperature coefficient and comprising first, second and third doped regions formed in the substrate, wherein the first doped region forms a p-n junction with the second doped region, wherein the second doped region forms a p-n junction with the third doped region, wherein the first doped region is directly conductively connected with the gate electrode, and wherein the third doped region is directly conductively connected with the first terminal
    wherein the thermosensitive element is thermally coupled to the power field effect transistor,
    wherein the thermosensitive element is configured to cause the power field effect transistor to reduce the load current in case of an exceedance of a limit temperature of the power field effect transistor by interconnecting the gate and the first terminal via conduction across the first, second and third doped regions of the thermosensitive element.

15. The method of claim 14, wherein the thermosensitive element is a bipolar transistor comprising an emitter, a collector, and a base, wherein the first doped region is the collector, wherein the second doped region is the base, and wherein the third doped region is the emitter wherein the base is electrically open, wherein the bipolar transistor is thermally connected to the power field effect transistor.

16. The method of claim 14, wherein the power field effect transistor is a vertical device disposed between a front surface of the substrate and a back surface of the substrate, and wherein the method further comprises:
    forming a trench in the front surface of the substrate; and
    forming the thermosensitive element in the trench.

17. The method of claim 15, further comprising: forming an isolation layer on a front surface of the substrate; and forming the bipolar transistor on the isolation layer.

18. The method of claim 14, wherein the first, second and third doped regions each extend to an upper surface of the substrate.

\* \* \* \* \*